United States Patent
Ozono et al.

(10) Patent No.: US 6,209,196 B1
(45) Date of Patent: Apr. 3, 2001

(54) METHOD OF MOUNTING BUMPED ELECTRONIC COMPONENTS

(75) Inventors: Mitsuru Ozono, Chikushino; Hideki Eifuku, Omuta; Tadahiko Sakai, Fukuoka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/234,299

(22) Filed: Jan. 21, 1999

(30) Foreign Application Priority Data

Jan. 26, 1998 (JP) .................................................. 10-012482

(51) Int. Cl.$^7$ ...................................................... H05K 3/34
(52) U.S. Cl. ................. 29/840; 29/832; 29/840; 29/846; 29/877; 29/878
(58) Field of Search ............................. 29/832, 840, 846, 29/877, 878

(56) References Cited

U.S. PATENT DOCUMENTS

| | | | | |
|---|---|---|---|---|
| 4,312,692 | * | 1/1982 | Ikeda et al. | 156/272 |
| 4,680,226 | * | 7/1987 | Takeda | 428/327 |
| 5,071,787 | * | 12/1991 | Mori et al. | 437/183 |
| 5,074,947 | * | 12/1991 | Estes et al. | 156/307.3 |
| 5,084,961 | * | 2/1992 | Yoshikawa | 29/840 |
| 5,086,558 | * | 2/1992 | Grube et al. | 29/832 |
| 5,283,947 | * | 2/1994 | Santo et al. | 29/840 |
| 5,384,952 | * | 1/1995 | Matsui | 29/840 |
| 5,477,419 | * | 12/1995 | Goodman et al. | 361/760 |
| 5,545,281 | * | 8/1996 | Matsui et al. | 156/273.7 |
| 5,757,078 | * | 5/1998 | Matsuda | 257/737 |
| 5,843,251 | * | 12/1998 | Tsukagoshi et al. | 156/64 |

FOREIGN PATENT DOCUMENTS 9167785   6/1997   (JP) .

* cited by examiner

*Primary Examiner*—Lee Young
*Assistant Examiner*—Paul D. Kim
(74) *Attorney, Agent, or Firm*—Stevens, Davis, Miller & Mosher, LLP

(57) ABSTRACT

A method of mounting bumped electronic components without using a flux during the solder joining process, which is low in cost and offers high reliability of the assembly. Resin adhesive 4 containing filler particles 4a is applied to a board 1 formed with electrodes 2, and a bumped electronic component 5 is mounted onto the board 1 to press the bumps 7 of the electronic component 5 against the electrodes 2 of the board 1. As a result, the oxide films 7a over the surfaces of the solder bumps 7 are broken by the filler particles 4a present in a gap between the lower ends of the solder bumps 7 and the surfaces of the electrodes 2, thus exposing the solder. This process eliminates the need for using the flux when the solder bumps 7 are melted and soldered to the electrodes 2, and therefore the cleaning process after soldering is not required, assuring high reliability of the assembly.

22 Claims, 6 Drawing Sheets

METHOD OF MOUNTING BUMPED ELECTRONIC COMPONENTS

BACKGROUND OF THE INVENTION

The present invention relates to a method for mounting bumped electronic components to a board or substrate.

As a means for mounting electronic parts onto electrodes of a circuit pattern on a board, there has been known a method which forms solder portions, such as solder bumps and solder precoats, on electronic components to be mounted or on electrodes of the board beforehand and joins the electronic components to the electrodes of the board by means of the solder portions. The soldering process involves applying a flux to the solder portions or the electrodes of the board, mounting the electronic components onto the electrodes, and heating and melting the solder to join the solder portions and the electrodes together. After the solder joints have been formed, the assembly is subjected to cleaning to remove flux residues to enhance the reliability after the mounting, followed by filling an underfill resin into gaps between the bumped electronic parts and the board to reinforce the joints. The underfill resin is then hardened by heat treatment, thus completing the mounting process.

The bumped electronic parts mounting process described above, however, poses the following problems as the electronic parts are miniaturized. First, because the use of such solvents as fluorocarbon, which have been in wide use, for cleaning is restricted by law, the cleaning process after soldering has become complicated and risen in cost, which, combined with on-going reductions in the size of electronic components, has contributed to making the cleaning process technically difficult. As to the underfill resin, miniaturization of electronic components reduces the gaps between the electronic components and the board and therefore makes the filling of resin after the mounting of electronic components difficult, resulting in unstable quality of the assembly. In addition to this quality problem, the above conventional mounting method has another problem that it requires two heating processes for the mounting of each component, one for soldering and one for hardening the resin, thus complicating the process.

SUMMARY OF THE INVENTION

It is therefore an object of the present invention to provide a bumped electronic component mounting method which does not use fluxes in the soldering of the mounting process and has low cost and high reliability after mounting.

According to the feature of the present invention, there is provided a method of mounting bumped electronic components, comprises the steps of: applying a resin adhesive containing a filler to a board formed with electrodes; mounting a bumped electronic component formed with solder bumps onto the board; pressing the solder bumps of the bumped electronic component against the electrodes of the board to break oxide films formed over the surfaces of the solder bumps with the filler; and heating the solder bumps to join the bumped electronic component to the electrodes.

According to another feature of the present invention, there is provided a method of mounting bumped electronic components, comprises the steps of: applying a resin adhesive containing a filler to a board formed with electrodes and with solder precoats over the electrodes; mounting a bumped electronic component formed with solder bumps onto the board; pressing the solder bumps against the solder precoats formed over the electrodes of the board to break oxide films formed over the surfaces of the solder bumps and the solder precoats with the filler; and heating the solder bumps and the solder precoats to join the bumped electronic component to the electrodes.

According to still another feature of the present invention, there is provided a method of mounting bumped electronic components as mentioned above, in which a high melting point solder is used as a solder material for either the solder bumps of the electronic component or the solder precoats over the electrodes of the board and a low melting point solder is used as a solder material for the other.

According to further feature of the present invention, there is provided a method of mounting bumped electronic components, comprises the steps of: applying a resin adhesive containing a filler to a board formed with electrodes and with solder precoats over the electrodes; mounting a bumped electronic component formed with metal bumps onto the board; pressing the metal bumps against the solder precoats formed over the electrodes of the board to break oxide films formed over the surfaces of the solder precoats with the filler; and heating the solder precoats to join the bumped electronic component to the electrodes.

According to still further feature of the present invention, there is provided a method of mounting bumped electronic components, comprises the steps of: applying a resin adhesive containing a filler to a board formed with electrodes and with metal bumps over the electrodes; mounting a bumped electronic component formed with solder bumps onto the board; pressing the solder bumps against the metal bumps formed over the electrodes of the board to break oxide films formed over the surfaces of the solder bumps with the filler; and heating the solder bumps to join the bumped electronic component to the metal bumps of the electrodes.

According to the present invention as set forth in the appended claims, the resin adhesive containing a filler is applied to the board prior to the mounting of the bumped electronic component, and the solder portions are pressed against the electrodes or against the solder portions or metal bumps formed over the electrodes with the filler interposed therebetween to break the oxide films on the surfaces of the solder portions, thereby making it possible to solder the electronic component to the electrodes of the board without using a flux. As mentioned above, while the oxide films on the surfaces of the solder portions are broken by the deformation of the solder itself under pressure in the mounting process, according to the present invention as set forth in the appended claims, the oxide films are more effectively broken by the resin adhesive containing a filler, so that the reliability of the mounting is effectively enhanced.

DETAILED DESCRIPTION OF THE INVENTION (Embodiment 1)

Figure 1A:
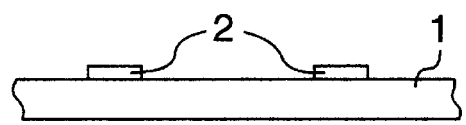
FIGS. 1A to 1C are schematic views showing the process of mounting a bumped electronic component according to an embodiment 1 of the present invention.
Figure 1B:
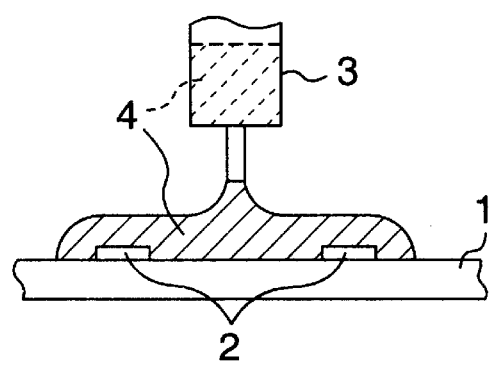

FIGS. 1A–1C, 2A–2B and 3 are schematic views showing the process of mounting a bumped electronic component according to an embodiment 1 of the present invention. Referring to FIG. 1A, electrodes 2 are formed on the upper surface of a board or substrate 1. The surface of each of the electrodes 2 is plated with a metal such as gold. The board 1 is coated with a resin adhesive 4 supplied from a dispenser 3 to cover the electrodes 2, as shown in FIG. 1B. The resin adhesive 4 contains 30–50% by weight of a filler of solid particles several microns across. The filler alleviates thermal stresses caused by a difference in thermal expansion coefficient between the board 1 and the electronic components mounted thereon, and can use both inorganic materials such as silica and organic materials such as resin.

Figure 1C:
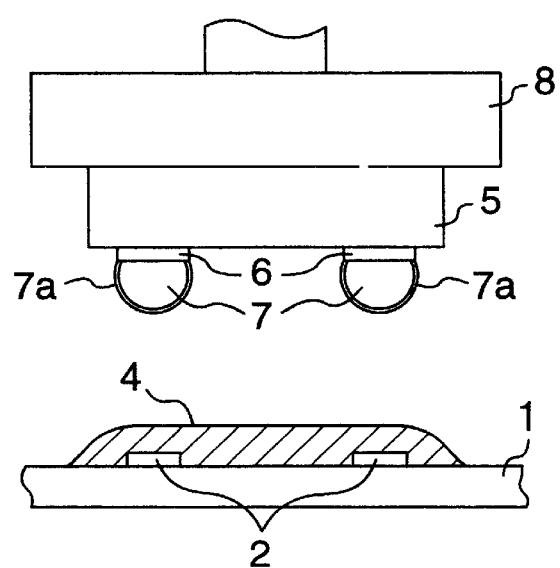

Then as shown in FIG. 1C, a bumped electronic component 5 held by a mounting tool 8 is mounted onto the board 1. Electrodes 6 of the electronic component 5 are formed with solder bumps 7, each of which has an oxide film 7a formed thereon. By joining the solder bumps 7 to the electrodes 2, the electronic component 5 is mounted onto the board 1.

Figure 2A:
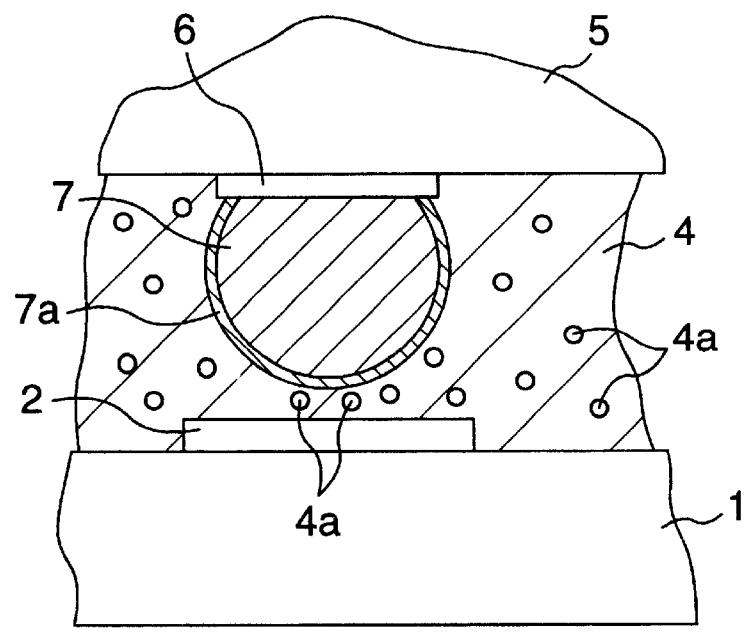
FIGS. 2A and 2B are schematic views showing the process of mounting a bumped electronic component according to the embodiment 1 of the present invention.

This soldering process will be described by referring to FIGS. 2A and 2B. FIG. 2A shows the state of the solder bumps 7 immediately before their lower ends contact the surfaces of the electrodes 2 of the board 1 after the electronic component 5 has been lowered relative to the board 1. In FIG. 2A, there are filler particles 4a between the oxide films 7a of the lower end surfaces of the solder bumps 7 and the surfaces of the electrodes 2. Because the content of the filler is 30–50% by weight as described above, countless filler particles 4a exist in the gaps between the oxide films 7a and the electrodes 2.

Figure 2B:
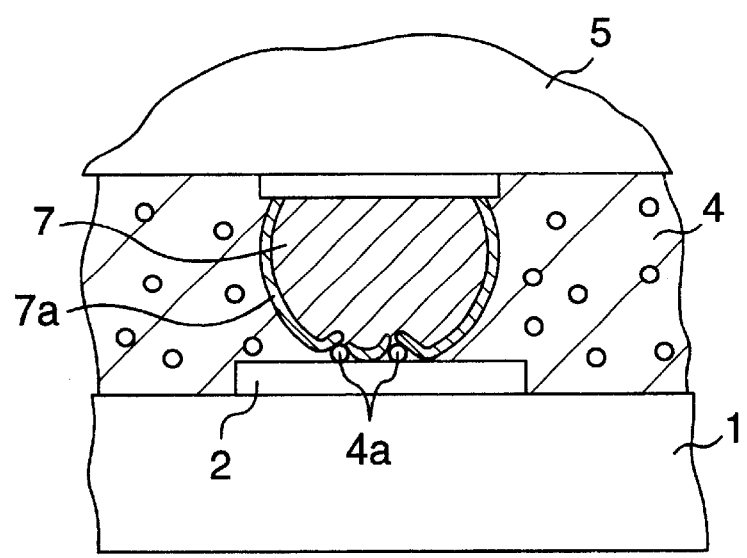

In this state, when the mounting tool 8 is further lowered to press the solder bumps 7 against the electrodes 2, the oxide films 7a of the solder bumps 7 pressed against the surfaces of the electrodes 2 are broken by the filler particles 4a, as shown in FIG. 2B. The oxide films 7a formed over the surfaces of the solder bumps 7 are very thin, ranging from about several tens to several thousands of angstrom in thickness, and thus are easily broken by the filler particles 4a, so that countless, fine exposing portions are formed at the contact areas, where the oxide films 7a are broken, between the lower ends of the solder bumps 7 and the electrodes 2.

Figure 3:
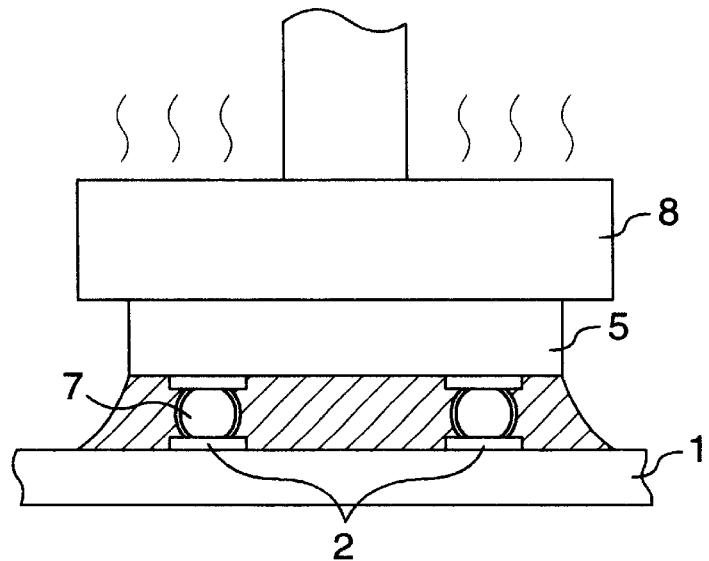
FIG. 3 is a schematic view showing the process of mounting a bumped electronic component according to the embodiment 1 of the present invention.

Next, as shown in FIG. 3, the solder bumps 7 are heated by a heating means of the mounting tool 8 through the electronic component 5, so that the temperature of each of the solder bumps 7 rises. When the temperature reaches the melting point of a solder, the solder bumps 7 melt. At this time, because fine, countless solder exposing portions are formed at the contact area, where the oxide films 7a are broken between the lower ends of the solder bumps 7 and the electrodes 2, the molten solder comes into contact with the upper surfaces of the electrodes 2 and spreads with good wettability. Because the surroundings of the joints between the solder bumps 7 and the electrodes 2 are filled with the resin adhesive and have a no-oxygen atmosphere, the exposed solder that has flowed out of the broken oxide films 7a is not oxidized again, thus assuring a good solder joining.

On cooling in this state, the molten solder solidifies and is joined to the upper surfaces of the electrodes 2. After this, the heating is continued to harden the resin adhesive 4, thus completing the mounting of the electronic component 5. This soldering process does not require the use of a flux as the conventional method does to eliminate the oxide films 7a, and therefore there is no need for cleaning after the joining process, assuring the reliability of the joints thus formed.

(Embodiment 2)

FIGS. 4A–4C and FIG. 5 show the process of mounting a bumped electronic component according to an embodiment 2 of the present invention. While, in the embodiment 1, there are formed solder bumps on the electronic component to be mounted on the board, in the embodiment 2, there are formed solder precoats and solder bumps both on the board and on the electronic component.

Figure 4A:
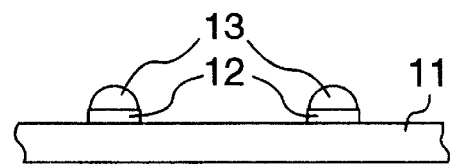
FIGS. 4A to 4C are schematic views showing the process of mounting a bumped electronic component according to an embodiment 2 of the present invention.
Figure 4B:
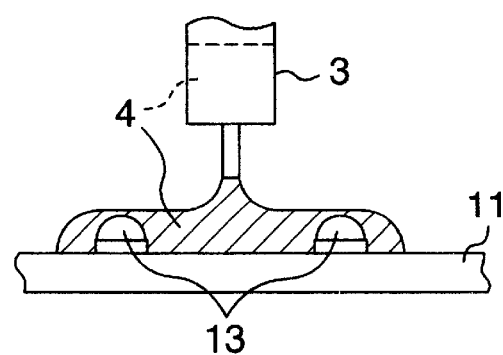
Figure 4C:
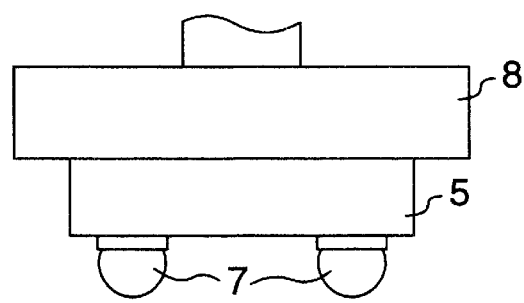
Figure 4C:
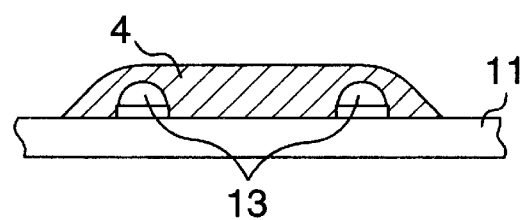

As shown in FIG. 4A, electrodes 12 of a board 11 are each formed with a solder precoat 13 thereon. Next, as with the embodiment 1 (see FIG. 1B), a resin adhesive 4 containing a filler is applied to the board 11. Then, a bumped electronic component 5 having the solder bumps 7 is mounted on and soldered to the board 11.

Figure 5:
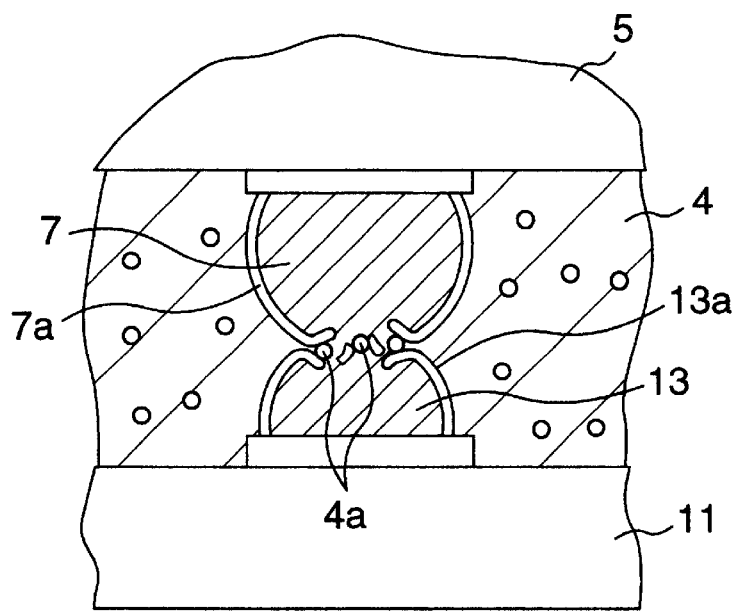
FIG. 5 is a schematic view showing the process of mounting a bumped electronic component according to the embodiment 2 of the present invention.

The process of the above soldering will be explained by referring to FIG. 5. The solder bumps 7 of the electronic component 5 are aligned in position with the solder precoats 13 and the electronic component 5 is lowered relative to the board 11 until the solder bumps 7 engage the solder precoats 13. At this point, there are countless fine filler particles 4a between the oxide films 7a on the surfaces of the solder bumps 7 and the oxide films 13a on the surfaces of the solder precoats 13.

In this state, when the solder bumps 7 and the solder precoats 13 are pressed against each other, the oxide films 7a and the oxide films 13a are both broken by the filler particles 4a, forming countless fine solder exposing portions in the surfaces of the oxide films 7a, 13a. Then, when the electronic component 5 is heated by the mounting tool 8 and the temperature reaches the melting temperature of the solder, the solder bumps 7 and the solder precoats 13 start melting. The solder bumps 7 and the solder precoats 13 merge together through the solder exposing portions, after which the merged molten solder solidifies and thus the electronic component 5 is joined to the electrodes 12. At this time because, as in the embodiment 1, the surroundings of the solder bumps 7 and the solder precoats 13 are filled with a resin adhesive and have a no-oxygen atmosphere, the exposed solder that has flowed out of the broken oxide films 7a, 13a is not oxidized again, thus forming good solder joints.

While the embodiment 2 uses the same solder for both the solder bumps 7 and the solder precoats 13, it is possible to use a high melting point solder for the solder bumps 7 or the solder precoats 13 and a low melting point solder for the other solder portions. This offers the following advantage. During the process of heating the electronic component 5 by the mounting tool 8, either the solder bumps 7 or solder precoats 13 using the low melting point solder first start melting. At this point, the other opposing solder portion, either the solder precoats 13 or the solder bumps 7, using the high melting point solder has not yet started melting. Thus, when the electronic component 5 is pressed against the board 11, the solder bumps 7 and the solder precoats 13 are not crushed while they melt simultaneously. Therefore, the electronic component 5 can be maintained at a desired mounting height on the board 11, forming good solder joints.

Examples of the low melting point solder include a commonly used solder comprising 67% of Sn and 37% of Pb with a melting temperature of 183° C. and a solder comprising 37.5% of Sn, 37.5% of Pb and 25% of In with a melting temperature of 138° C. Among the high melting point solders are one comprising 96.5% of Sn and 3.5% of Ag with a melting temperature of 221° C., one comprising 5% of Sn and 95% of Pb with a melting temperature of 314° C. and the like.

(Embodiment 3)

FIGS. 6A–6C and FIG. 7 show the process of mounting a bumped electronic component according to an embodiment 3 of the present invention. In the embodiment 3, each solder precoat is formed over the electrodes of the board and each metal bump is formed on the electrodes of the electronic component.

Figure 6A:
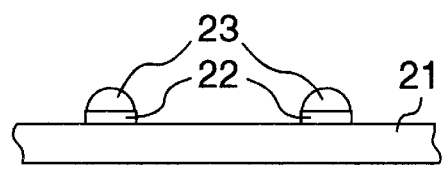
FIGS. 6A to 6C are schematic views showing the process of mounting a bumped electronic component according to an embodiment 3 of the present invention.
Figure 6B:
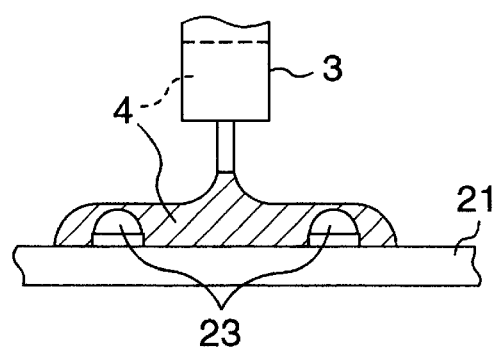
Figure 6C:
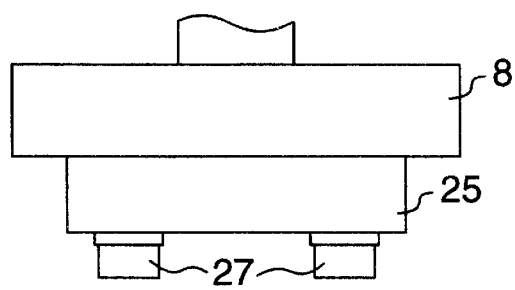
Figure 6C:
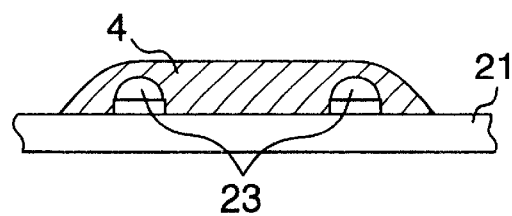

As shown in FIG. 6A, each solder precoat 23 is formed over electrodes 22 of a board 21. Next, a resin adhesive 4 containing a filler is applied to the board 21 as in the case with the embodiment 1 (see FIG. 1B). Then, an electronic component 25 with gold bumps 27 as metal bumps is mounted onto the board 21. The metal bumps may be formed of other materials than gold by the wire bonding, plating or transfer method depending on the material used.

Figure 7:
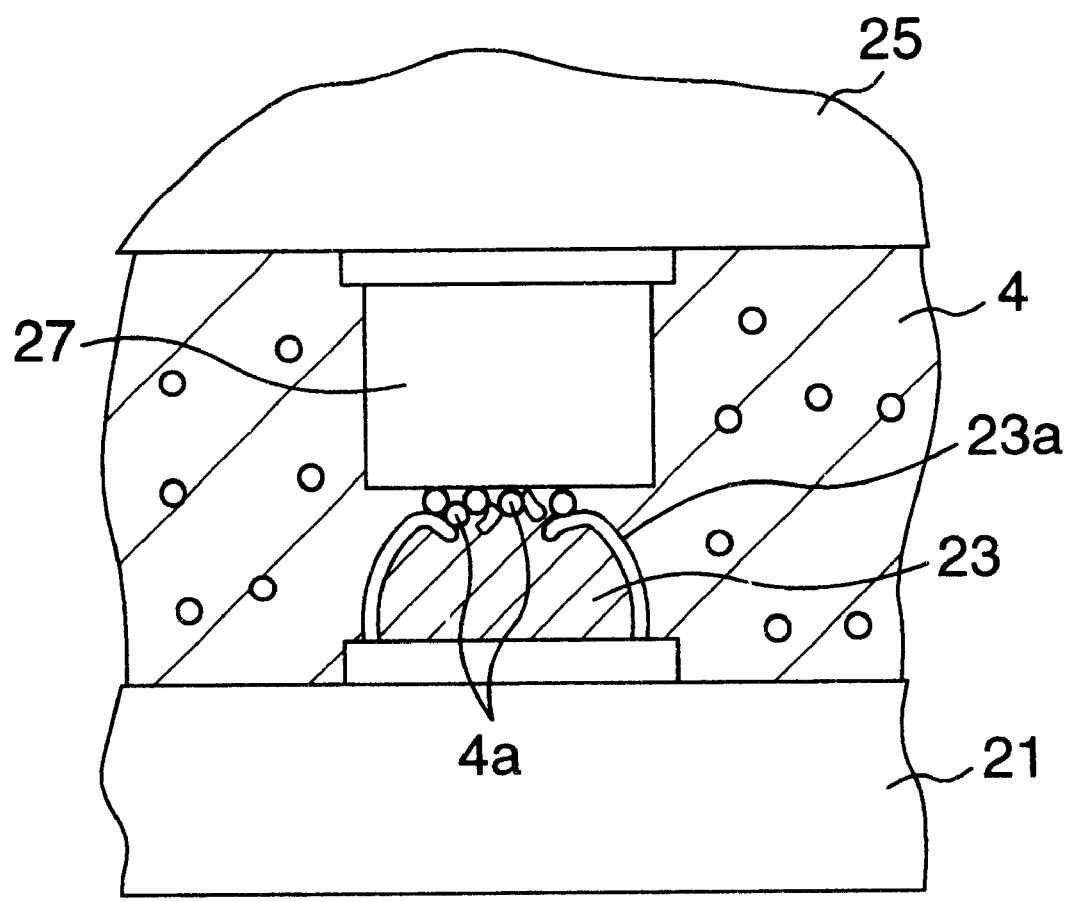
FIG. 7 is a schematic view showing the process of mounting a bumped electronic component according to the embodiment 3 of the present invention.

The process of mounting and soldering the electronic component 25 to the board 21 is explained by referring to FIG. 7. With the gold bumps 27 of the electronic component 25 aligned in position with the solder precoats 23 of the board 21, the electronic component 25 is lowered relative to the board 21 to bring the gold bumps 27 into engagement with the solder precoats 23. At this point, there are countless fine filler particles 4a between the gold bumps 27 and the oxide films 23a over the surfaces of the solder precoats 23.

In this state, when the gold bumps 27 and the solder precoats 23 are pressed against each other, the oxide films 23a are broken by the filler particles 4a, forming countless fine solder exposing portions in the surfaces of the oxide films 23a. Then as the electronic component 25 is heated by the mounting tool 8 and the temperature rises to the melting temperature of the solder, the solder precoats 23 start melting. The molten solder wets the surfaces of the gold bumps 27 with good solder wettability, after which the molten solder solidifies and thus the electronic component 25 is joined to the electrodes 22. At this time, the surroundings of the gold bumps 27 and the solder precoats 23 are filled with a resin adhesive and have a no-oxygen atmosphere, so that the exposed solder that has flowed out of the broken oxide films 23a is not oxidized again, thus forming good solder joints.

While, in this embodiment 3, each of the gold bumps 27 is provided to the electronic component 25 and each of the solder precoats 23 is provided to the board 21, they may be reversed, i.e., the electronic component 25 may be provided with solder precoats and the board 21 with gold bumps.

It should be noted that this invention is not limited to the above embodiments 1, 2 and 3. Although all of the above three embodiments concern a case where the solder is melted during the heating process to form joints, the joining may be achieved by pressing the solder at temperature below the melting point, i.e., without heating it to the melting temperature, to effect the joining through solid-state diffusion. Further, while the above three embodiments press the electronic component 5 against the board 1, 11 before heating it by the mounting tool 8, the electronic component 5 may be heated while being pressed against the board 1, 11.

With this invention, because the resin adhesive containing a filler is applied to the board prior to mounting an electronic component on the board and because the solder bumps and the solder precoats formed over the electronic component and/or the electrodes of the board are pressed against each other via a filler interposed therebetween so as to break the oxide film of the surfaces of the solder bumps or the solder precoats, the electronic component can be soldered to the board without using a flux, which in turn obviates the need for cleaning after the soldering. Further, because a resin adhesive for underfill, which is to be filled into a gap between the board and the electronic component, is applied beforehand to the board, the electronic component, even when it is small and its gap is narrow, can be sealed with the resin in good condition, effectively reinforcing the solder joints and enhancing the reliability of the assembly.

What is claimed is:

1. A method of mounting bumped electronic components, said method comprising the steps of:
   (a) applying a resin adhesive containing a filler to a board formed with electrodes;
   (b) mounting a bumped electronic component formed with solder bumps onto the board;
   (c) pressing the solder bumps of the bumped electronic component against the electrodes of the board to break, with the filler, oxide films formed over the surfaces of the solder bumps; and
   (d) directly joining the solder bumps to the electrodes of the board by heating the solder bumps while pressing the solder bumps against the electrodes and while hardening the resin adhesive, so that the bumped electronic component is joined to the electrodes.

2. The method according to claim 1, wherein the filler contained in the resin adhesive applied in step (a) comprises at least one of an organic and an inorganic material.

3. The method according to claim 2, wherein said organic material comprises resin and said inorganic material comprises silica.

4. The method according to claim 1, wherein the direct joining recited in step (d) further comprises heating the solder bumps to melt the solder bumps.

5. The method according to claim 1, wherein the direct joining recited in stop (d) further comprises applying heating so that the joining is effected through solid-state diffusion.

6. A method of mounting bumped electronic components, said method comprising the steps of:
   (a) applying a resin adhesive containing a filler to a board formed with electrodes, said electrodes having solder precoats formed thereover;
   (b) mounting a bumped electronic component formed with solder bumps onto the board;
   (c) pressing the solder bumps against the solder precoats formed over the electrodes of the board to break, with the filler, oxide films formed over the surfaces of the solder bumps and the solder precoats; and
   (d) directly joining the solder bumps to the solder precoats by heating the solder bumps and the solder precoats while pressing the solder bumps and the solder precoats together and while hardening the resin adhesive, so that the bumped electronic component is joined to the electrodes.

7. A method of mounting bumped electronic components according to claim 2, wherein a high melting point solder is used as a solder material for either the solder bumps of the electronic component or the solder precoats over the electrodes of the board and a low melting point solder is used as a solder material for the other.

8. The method according to claim 6, wherein the filler contained in the resin adhesive applied in step (a) comprises at least one of an organic and an inorganic material.

9. The method according to claim 8, wherein said organic material comprises resin and said inorganic material comprises silica.

10. The method according to claim 6, wherein the direct joining recited in step (d) further comprises heating the solder bumps to at least at a melting temperature.

11. The method according to claim 6, wherein the direct joining recited in step (d) further comprises heating the solder precoats to at least a melting temperature.

12. The method according to claim 6, wherein the direct joining recited in stop (d) further comprises applying heating so that the joining is effected through solid-state diffusion.

13. A method of mounting bumped electronic components comprising the steps of:
   (a) applying a resin adhesive containing a filler to a board formed with electrodes and with solder precoats over the electrodes;
   (b) mounting a bumped electronic component formed with metal bumps onto the board;
   (c) pressing the metal bumps against the solder precoats formed over the electrodes of the board to break oxide films formed over the surfaces of the solder precoats with the filler; and
   (d) directly joining the metal bumps to the solder precoats by heating the solder precoats while pressing the solder precoats against the metal bumps and while hardening the resin adhesive, so that the bumped electronic component is joined to the electrodes.

14. The method according to claim 13, wherein the filler contained in the resin adhesive applied in step (a) comprises at least one of an organic and an inorganic material.

15. The method according to claim 14, wherein said organic material comprises resin and said inorganic material comprises silica.

16. The method according to claim 13, wherein the direct joining recited in step (d) further comprises heating the solder precoats to at least a melting temperature.

17. The method according to claim 13, wherein the direct joining recited in step (d) further comprises applying heating so that the joining is effected through solid-state diffusion.

18. A method of mounting bumped electronic components, said method comprising the steps of:
   (a) applying a resin adhesive containing a filler to a board formed with electrodes and with metal bumps over the electrodes;
   (b) mounting a bumped electronic component formed with solder bumps onto the board;
   (c) pressing the solder bumps against the metal bumps formed over the electrodes of the board to break, with the filler, oxide films formed over the surfaces of the solder bumps; and
   (d) directly joining the solder bumps to the metal bumps by heating the solder bumps while pressing the solder bumps against the metal bumps and while hardening the resin adhesive, so that the bumped electronic component is joined to the metal bumps of the electrodes.

19. The method according to claim 18, wherein the filler contained in the resin adhesive applied in step (a) comprises at least one of an organic and an inorganic material.

20. The method according to claim 19, wherein said organic material comprises resin and said inorganic material comprises silica.

21. The method according to claim 18, wherein the direct joining recited in step (d) further comprises heating the solder bumps to at least a melting temperature.

22. The method according to claim 18, wherein the direct joining recited in step (d) further comprises applying heating so that the joining is effected through solid-state diffusion.

* * * * *